United States Patent
Nickel

(10) Patent No.: US 11,137,461 B2
(45) Date of Patent: Oct. 5, 2021

(54) MAGNETIC RESONANCE METHOD AND APPARATUS FOR DETERMINATION OF QUANTITATIVE TISSUE PARAMETERS

(71) Applicant: Siemens Healthcare GmbH, Erlangen (DE)

(72) Inventor: Marcel Dominik Nickel, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 51 days.

(21) Appl. No.: 16/433,445

(22) Filed: Jun. 6, 2019

(65) Prior Publication Data

US 2019/0377046 A1 Dec. 12, 2019

(30) Foreign Application Priority Data

Jun. 7, 2018 (EP) ..................................... 18176587

(51) Int. Cl.
*G01R 33/48* (2006.01)
*G01R 33/56* (2006.01)
*G06T 7/00* (2017.01)

(52) U.S. Cl.
CPC ..... *G01R 33/4828* (2013.01); *G01R 33/5608* (2013.01); *G06T 7/0014* (2013.01); *G06T 2207/10088* (2013.01)

(58) Field of Classification Search
None
See application file for complete search history.

(56) References Cited

U.S. PATENT DOCUMENTS 10,194,829 B2 * 2/2019 Kaditz .................. A61B 5/055
2005/0013471 A1 * 1/2005 Snoeren ................... G06T 7/35
382/131

(Continued)

FOREIGN PATENT DOCUMENTS

DE 102014214828 A1 2/2016

OTHER PUBLICATIONS

Doneva , Mariya "Dictionary & Model-Based Methods" Proceedings of the International Society for Magnetic Resonance in Medicine; 25th Annual Meeting & Exhibition; No. 8110; Apr. 7, 2017 (Apr. 7, 2017); USA.

(Continued)

*Primary Examiner* — Nasima Monsur
(74) *Attorney, Agent, or Firm* — Schiff Hardin LLP

(57) ABSTRACT

In a magnetic resonance method and apparatus for the quantitative spatially resolved determination of a physiological tissue parameter of an examination subject, a signal model is determined with m different signal parameters that influence an MR signal of the subject. N different MR images of the subject are recorded with m⇐N, and measured data tuples with N measured values are determined from the N MR images. A lookup table is created with multiple table entries, which each assigns an N-dimensional tuple of t synthesized measured values, which were calculated using the signal model, to an m-dimensional tuple of signal parameters. The lookup table is pre-processed into a sorted lookup table, and at least some of the signal parameters are determined by comparing the pixel-by-pixel measured data tuples with N dimensional tuples of the synthesized measured values in the sorted lookup table for at least some of the pixels.

15 Claims, 3 Drawing Sheets

(56) References Cited

U.S. PATENT DOCUMENTS

| | | | |
|---|---|---|---|
| 2005/0231199 A1* | 10/2005 | Rajagopalan | G01R 33/56 324/309 |
| 2014/0073946 A1* | 3/2014 | Rodriguez-Llorente | A61B 5/7246 600/476 |
| 2016/0033604 A1 | 2/2016 | Grodzki | |
| 2016/0178787 A1* | 6/2016 | Le | G01V 3/28 702/7 |
| 2016/0349341 A1 | 12/2016 | Cohen | |

OTHER PUBLICATIONS

Muja, Marius et al. "Scalable Nearest Neighbor Algorithms for High Dimensional Data" IEEE Transactions on Pattern Analysis and Machine Intelligence, vol. 36, Issue: 11, Nov. 1 2014 // DOI: 10.1109/TPAMI.2014.2321376.

Bentley, Jon Louis "K-d Trees for Semidynamic Point Sets" SCG '90 Proceedings of the sixth annual symposium on Computational geometry, pp. 187-197, 1990 // doi>10.1145/98524.98564.

Kleinberg, Jon M. "Two Algorithms for Nearest-Neighbor Search in High Dimensions" STOC '97 Proceedings of the twenty-ninth annual ACM symposium on Theory of computing, pp. 599-608, 1997 // doi>10.1145/258533.258653.

Friedman, Jerome H. et al. "An Algorithm for Finding Best Matches in Logarithmic Expected Time" ACM Transactions on Mathematical Software (TOMS), vol. 3 Issue 3, pp. 209-226, Sep. 1977 // doi>10.1145/355744.355745.

Arya, Sunil et al. "Algorithms for Fast Vector Quantization" IEEE—DCC'93: Data Compression Conference, 1993 // DOI: 10.1109/DCC.1993.253111.

Muja, Marius et al. "Fast Matching of Binary Features" CRV '12 Proceedings of the 2012 Ninth Conference on Computer and Robot Vision, 2012 // doi>10.1109/CRV.2012.60.

Marty, B. et al. "Fast, precise, and accurate myocardial T1 mapping using a radial MOLLI sequence with FLASH readout" Magnetic Resonance in Medicine, vol. 79, No. 3, Jul. 2017 // https://doi.org/10.1002/mrm.26795.

Muja, Marius et al. "Fast Approximate Nearest Neighbors With Automatic Algorithm Configuration" VISAPP International Conference on Computer Vision Theory and Applications, 2009.

Arya, Sunil et al. "An Optimal Algorithm for Approximate Nearest Neighbor Searching in Fixed Dimensions" Journal of the ACM (JACM), vol. 45, Issue 6, pp. 891-923, Nov. 1998 // doi>10.1145/293347.293348.

Seiberlich, N. et al. "Average Correlation Orthogonal Matching Pursuit for Improved Relaxation Parameter Estimation" Proceedings of the International Society for Magnetic Resonance in Medicine, 19th Annual Meeting & Exhibition, p. 2742, 2011.

European Search Report dated Dec. 12, 2018, for Application No. 18176587.6.

* cited by examiner

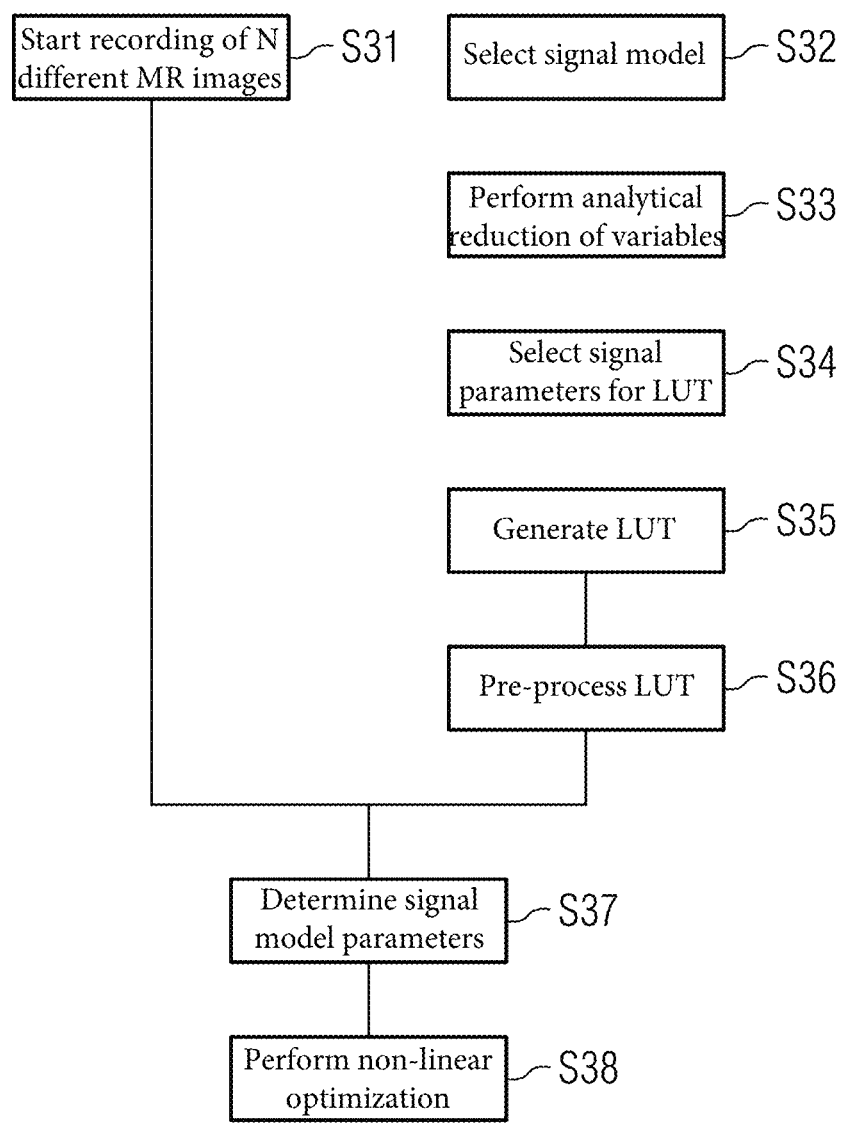

MAGNETIC RESONANCE METHOD AND APPARATUS FOR DETERMINATION OF QUANTITATIVE TISSUE PARAMETERS

BACKGROUND OF THE INVENTION

Field of the Invention

The present invention concerns a method for using magnetic resonance (MR) data in order to make quantitative spatially resolved determination of a physiological tissue parameter of an examination subject, and an MR apparatus and a non-transitory electronically readable data storage medium that implement such a method.

Description of the Prior Art

MR images in clinical imaging usually have a relative contrast, with the exact pixel values being subject to many influences, such as, for example, the parameter setting selected for the measurement. Further influencing factors are, for example, coil sensitivities and the field strength used, etc.

In many applications it is desirable to generate a quantitative MR image in which physiological tissue parameters such as, for example, a T1 time or other physiological parameters in the administration of contrast agent such as the time of arrival of the contrast agent, are available quantitatively in a spatially resolved manner.

These parameter cards are often fitted from conventional acquisitions, by assuming a signal model, the parameters of which vary in the underlying MR images that have been acquired. If sufficient MR data have been acquired with different parameter values, the parameters can be determined by fitting. In such cases, a separate fit is usually made for each pixel or each voxel. One possibility is to search for the solution using the least squares method. If the relevant problem cannot or can only partly be solved analytically, numerical optimizers can also be used, such as for example, the Levenberg-Marquardt or the Nelder-Mead algorithm.

These methods are sometimes very time-consuming and have the disadvantage that the optimal parameter value is not always found, but possibly only a local minimum and not the global minimum.

Furthermore, Magnetic Resonance Fingerprinting (MRF) is known with which quantitative parameter cards can be generated. With this technology, the raw data space is usually sampled (filled with acquired data) very quickly with a spiral trajectory, with a state of equilibrium being avoided by varying parameters such as the echo time or the repetition time, so a dynamic that is as high as possible is generated. From a series of simulated signal characteristics with varying input parameters, the signal characteristics that most closely resemble the signal characteristics in the individual pixels are then selected. With the selection of the time characteristic and hence of the input parameters, the physiological parameters are also determined. In this method, however, MR images that are not clinically usable are acquired, and usually several hundred highly under-sampled MR images are recorded, in order to be able to draw conclusions about the physiological tissue parameters from the signal path across the various recordings. The MR recordings recorded with this technology cannot be clinically evaluated because they do not correspond to any defined image contrast. Instead, it is assumed that contributions made by other pixels are incoherent and may be interpreted as noise. The intensity gradients in a pixel are therefore interpreted as extremely noisy signal characteristics of the measurement running in real time, which are fitted on complex Bloch simulations of the measurement.

SUMMARY OF THE INVENTION

An object of the present invention is to reduce the disadvantages described above and thereby provide a method for the quantitative determination of physiological tissue parameters that can be carried out more quickly, with not only a local optimum, but also a global optimum or minimum, being found in the calculation of the optimization method.

According to a first aspect of the invention, in a method for the quantitative spatially resolved determination of a physiological tissue parameter of an examination subject is provided, a signal model is determined in a computer with m different signal parameters, which influence an MR signal of the examination subject. Furthermore, N different MR images of the examination subject are recorded, where m is ⇐N, and where measured data tuples with N measured values are determined from the N MR images on a pixel by pixel basis. Furthermore, a lookup table is created with a number of table entries, with each table entry assigning an N-dimensional tuple of synthesized measured values that have been calculated using the signal model to an m-dimensional tuple of signal parameters. Pre-processing of the lookup table that has been created then implemented in the computer in order to produce a sorted lookup table in which the table entries have been arranged according to a defined criterion. The computer then determines at least some of the signal parameters by comparing the pixel-by-pixel measured data tuples with the N dimensional tuples in the sorted lookup table, for at least some of the pixels.

When comparing the measured data tuples that have been recorded with the calculated or synthesized MR signal values in the sorted lookup table, an optimization function that finds a result significantly faster than with traditional methods is used. The fitting required for the determination of the signal parameters becomes considerably faster and it becomes more precise due to the pre-processed lookup table, in which the table entries have been sorted according to a defined criterion. Furthermore, the global minimum of the optimization function is found in a better and more reliable manner than in methods according to the prior art. As a result thereof, it is possible to calculate more complex physiological tissue parameters, such as for example, pharmacokinetic modelling in the case of contrast-enhanced perfusion.

The acquired N MR images are preferably MR images in which the relevant raw data space is subdivided such that the MR images show a morphological full contrast and can be used for the diagnosis of the examination subject, for example, in a diagnosis by a physician.

The table entries in the sorted lookup table are preferably arranged such that the determination of the synthetic measurement value in the sorted lookup table that is nearest according to a given metric to a measured data tuple is possible with a nearest-neighbor method. Here, through sorting in the nearest-neighbor method, a number of comparison steps that is in the order of magnitude of a logarithm of the number of entries in the sorted lookup table is used. Here N is preferably <100, and more preferably <50 or even <10. This means that only a small number of MR images is recorded.

The comparison of the pixel-by-pixel measured data tuples with the sets of calculated MR signal values is equivalent to an optimization problem. Before carrying out the comparison, it is possible to eliminate at least one signal parameter analytically from the M different signal parameters such that the number of signal parameters for which various table entries appear in the lookup table is reduced.

The optimization problem when comparing the measured data tuples with the sets of calculated MR signal values can be solved with a nearest-neighbor search, or with an approximate nearest-neighbor search.

Furthermore, it is possible for the physiological tissue parameter that has been determined to be used as the starting point for a further non-linear optimization to determine an improved physiological tissue parameter. The result of the present method can be used as the starting value in a non-linear optimization to further improve the calculated physiological tissue parameter.

The pixels in the MR images that have been recorded can be subdivided into at least two different pixel phases as a function of a tissue parameter, a lookup table being created for each class of pixel. It is possible to create a number of lookup tables, for example, for tissue components that contain fat or water. If it is known after a fat-water separation whether fat or water is the dominant component, then different lookup tables can be used in the comparison for the different tissue types.

Furthermore, an MR apparatus is provided for the quantitative spatially resolved determination of the physiological tissue parameter. The MR apparatus has an MR scanner operated by a control computer configured to execute the aforementioned method according to the invention.

The present invention also encompasses a non-transitory, computer-readable data storage medium encoded with programming instructions that, when the storage medium is loaded into a computer or computer system, cause the computer or computer system to implement any or all embodiments of the method according to the invention, as described above.

BRIEF DESCRIPTION OF THE DRAWINGS

FIG. 3 is a flowchart of the basic steps for the quantitative spatially resolved determination of the physiological tissue parameter in accordance with the invention.

DESCRIPTION OF THE PREFERRED EMBODIMENTS

Figure 1:
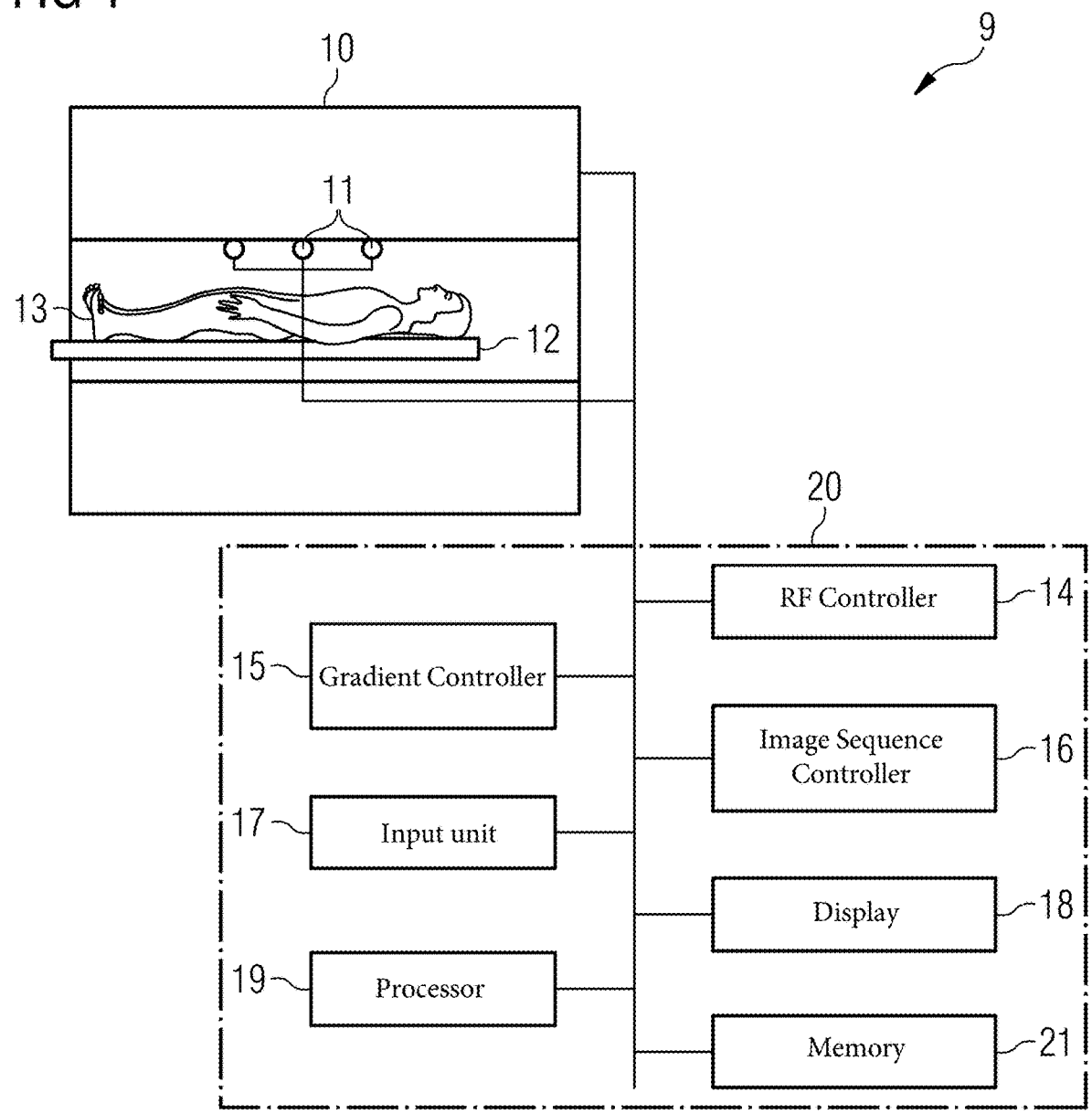
FIG. 1 schematically illustrates an MR apparatus with which, according to the invention, quantitative spatially resolved physiological tissue parameters can be calculated.

The present invention is described below in greater detail using preferred embodiments and with reference to the attached drawings. In the figures, the same reference characters denote the same or similar elements. Furthermore, the figures are schematic representations of various embodiments of the invention. Elements shown in the figures are not necessarily shown to scale. The elements shown in the figures are rather reproduced such that the function and purpose thereof are comprehensible to those skilled in the art. The connections between functional units or other elements that are shown in the figures can also be implemented as an indirect connection, it being possible for a connection to be wired or wireless. Functional units can be implemented as hardware, software, or as a combination of hardware and software.

In the determination of the physiological tissue parameters with the comparison of the recorded measured data tuples with the calculated MR signal values, an optimization method is used, and some optimization problems can be reformulated at least sometimes into a nearest-neighbor problem. That is the case in particular for pharmacokinetic modelling of contrast agent-enhanced MR imaging but can also be used in other methods, such as T1 time determination or the multi-echo Dixon technique.

For the nearest-neighbor problem there are two different optimization options:

a set of possible signals can be simulated in a given parameter space for the given acquisition, for what is known as the lookup table, from which the nearest signal is determined for each voxel in a second step. Since this procedure is repeated for very many pixels or voxels, it is sensible and possible to process in advance the simulated signal, that is, the lookup table that has been created, such that the determination of the nearest signal can be carried out very efficiently. Here, it is often possible for a search for the optimum value, which search is linear with the size of the lookup table, to be reduced to a complexity with the logarithm of the size. In the one-dimensional scenario, this is simple to detect in a signal parameter. In the one-dimensional scenario, the pre-processing can correspond to a sorting according to size. If one now searches for the best values for a measured data tuple in the lookup table, then depending on whether the measured data tuple is greater or smaller than the calculated MR signal values, half of the parameter space can no longer be taken into account in the search. Thus, in the search, the size of the parameter space is always halved, corresponding to a base-2 logarithm in the search.

FIG. 1 shows an MR apparatus with which, as is explained below, quantitative spatially resolved physiological tissue parameters can be calculated quickly.

The MR apparatus 9 comprises has an MR data acquisition scanner 10, which has a basic field magnet that generates a polarization field Bo. An examination subject 13, who is on a bed 12, is moved into the scanner 10 so as to record magnetic resonance signals from the examination subject 13. The RF coils 11 used to record the signal represent a whole-body coil or the local coils, either or both of which can be used. By emitting radio-frequency pulses and applying magnetic field gradients, the magnetization given nuclear spins in the subject 13 generated by the polarization field Bo can be deflected from the equilibrium position and spatially encoded, and the resulting MR signals are detected by the receiving coils 11. It is known to those skilled in the art how MR images can be generated by emitting RF pulses and by applying magnetic field gradients in various combinations and sequences, so this need not be explained in further detail herein.

The MR apparatus 9 further has a control computer 20, which controls the MR apparatus 9. The control computer 20 has an RF controller 14, and a gradient controller 15 that controls and applies the magnetic field gradients. The RF controller 14 controls and generates the RF pulses that deflect the magnetization. An image sequence controller 16 controls the sequence of applying the magnetic field gradients, signal detection, and radiating the RF pulses. An operator can control the MR apparatus 9 via an input unit 17, and MR images or other data necessary for control can be displayed on a display 18. At least one processor 19 is provided to control the various units in the control computer 20. Furthermore, a memory 21 is provided, in which programming modules or program code can be stored that, when executed by the processor 19, control the operating sequence of the MR apparatus 9. As explained below, the processor 19 is configured so that a quantitative spatially resolved determination of physiological tissue parameters in accordance with the invention is implemented.

The parametric imaging is based on acquiring different contrasts and extracting the underlying parameters by fitting them on a signal model. The different contrasts are morphological MR images or volumes that have been recorded using a plurality of measurement parameters. This can ensue through a plurality of individual measurements or simultaneously in one measurement.

Figure 2:
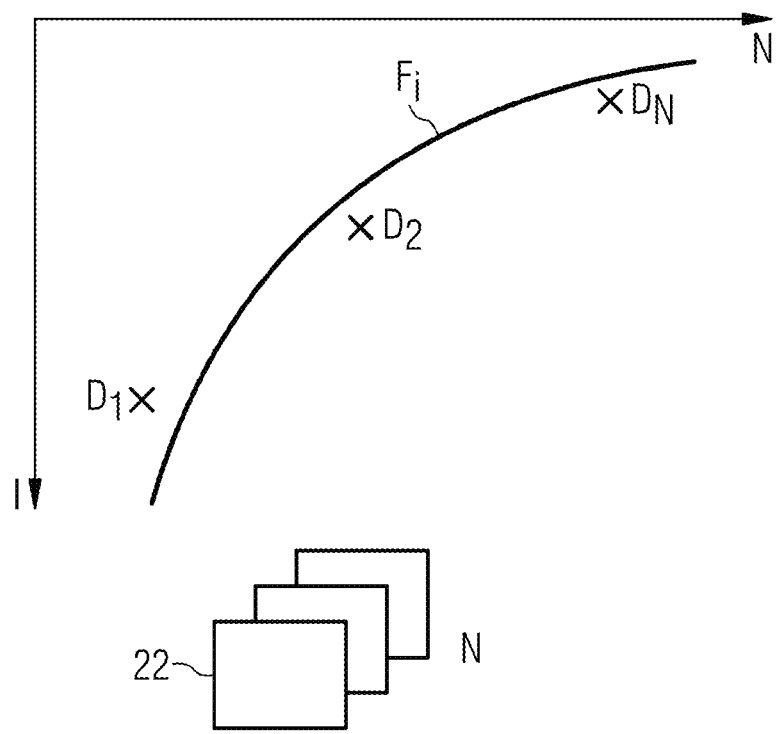
FIG. 2 schematically shows how the physiological tissue parameter is determined from a measured data tuple in accordance with the invention with the use of recorded MR images using the example of a T1 time.

FIG. 2 shows in schematic form the basic principles for the determination of a physiological tissue parameter, in this case the T1 time. Following an inversion pulse that deflects the magnetization by 180°, MR images such as, for example, the MR images 22 in FIG. 2, in the scenario shown three MR images, are recorded at different points of time in the relaxation curve. If the signal intensities above N are now determined on a pixel-by-pixel basis, this results, for example, in the signal intensities, $D_1$, $D_2$ to $D_N$. By assuming a signal model with different T1 times, a signal model can then be determined, the signal model $F_i$. As a result of an optimization problem, F can now be determined such that the signal model F depicts the measured data points $D_1$ to $D_N$ as well as possible.

For example, in conjunction with the administration of contrast agent, MR images can be recorded before, during, and after the administration of the contrast agent, so as in this way to calculate from the signal path the physiological tissue parameter such as the time of arrival of the contrast agent, the "arrival time" TA, and to determine the parameter TTP, time to peak, the wash-out curve, or the integral below the intensity curve. As pharmacokinetic models, these models can include the physiological parameters such as $k_{Trans}$, $k_{ep}$. As already explained in connection with FIG. 2, in the case of MR images with different inversion times, the parameters T1 or the proton density $M_0$ can be determined. Likewise, for example, the profile of the RF excitation pulse can be determined. In images with different T1 or T2 weightings, it is possible to determine the T1 time or the T2 time in a spatially resolved manner. In images with a different diffusion weighting, model parameters such as the ADC, apparent diffusion coefficient, the magnetization $M_0$ or the perfusion rate can be calculated. In the case of water-fat separation with multi-echo sequences, it is possible to calculate as parameters the water content, the fat content or relaxation times.

The determination of the signal model and the subsequent optimization process are described in general below. On a voxel or pixel, the contrasts are fitted on a signal model that typically has the following form:

$$\theta = \operatorname*{argmin}_{\theta} \sum_{i=1}^{N} |D_i(x) - F_i(\theta)|^2, \quad (1)$$

the values used being defined as follows:
θ: the vector of parameters determined, for example, $\theta=(M_0, T_1)$ or $\theta=(TA, k_{ep}, k_{trans})$ N: the number of contrasts, that is, the number of MR images recorded
$D_i(x)$: the complex-valued $i^{th}$ contrast of voxels/pixel x
$F_i(\theta)$: the value of the signal model for parameter settings of the $i^{th}$ contrast.

As an alternative to this, the following formula can also be used:

$$\theta = \operatorname*{argmin}_{\theta} \sum_{i=1}^{N} (|D_i(x)| - F_i(\theta))^2 \quad (2)$$

$$\theta = \operatorname*{argmin}_{\theta} \sum_{i=1}^{N} (G(D_i(x)) - F_i(\theta))^2 \quad (3)$$

In equation 3 above, the contrasts have been mapped on a different parameter, for example, signal intensities in the contrast agent-enhanced imaging have been converted into contrast agent concentrations. It is noted here that N, the number of MR images recorded, is greater than the number of model parameters m.

The original fit problem can sometimes be simplified by eliminating many parameters analytically $$F_i(\theta) = A f_i(\phi), \text{ where } \theta = (\phi, A) \quad (4)$$

where θ is one-dimensional, ϕN—one-dimensional and A is the $n^{th}$ parameter.

$$\Rightarrow \operatorname*{argmin}_{\theta} \sum_{i=1}^{N} |D_i - F_i(\theta)|^2 \quad (5)$$

$$= \operatorname*{argmin}_{\phi} \operatorname*{argmin}_{A} \sum_{i=1}^{N} |D_i - A f_i(\phi)|^2 \quad (6)$$

$$\sum_{i=1}^{N} |D_i - A f_i(\phi)|^2 = \quad (7)$$

$$|A|^2 \sum_{i=1}^{N} |f_i(\phi)|^2 - A \sum_{i=1}^{N} D_i^* f_i(\phi) + \sum_{i=1}^{N} |D_i|^2 - A^* \sum_{i=1}^{N} D_i f_i(\phi)$$

$$\Rightarrow A = \frac{\sum_{i=1}^{N} D_i f_i^*(\phi)}{\sum_{i=1}^{N} |f_i(\phi)|^2} \quad (8)$$

With the nominal definition $$e_i(\phi) = \frac{f_i(\phi)}{\sqrt{\sum_{i=1}^{N} |f_i(\phi)|^2}} \text{ we find} \quad (9)$$

$$\min_{A} \sum_{i=1}^{N} |D_i - A f_i(\phi)|^2 = \quad (10)$$

$$\sum_{i=1}^{N} \left| D_i - \left( \sum_{j=1}^{N} D_j e_j^*(\phi) \right) e_i(\phi) \right|^2 = \sum_{i=1}^{N} |D_i|^2 - \left| \sum_{j=1}^{N} D_j e_j^*(\phi) \right|^2$$

With the further definition of $$d_i = D_i / \sqrt{\sum_{i=1}^{N} |D_j|^2} \quad (11)$$

then $$\min_A \sum_{i=1}^{N} |D_i - Af_i(\phi)|^2 = \frac{1}{2\|D\|_2^2} \sum_{i=1}^{N} |d_i - e_i(\phi)|^2 \quad (12)$$

It can be seen from equation 12 that global scaling does not play a part in the search for the medium $$= \operatorname*{argmin}_{\theta} \sum_{i=1}^{N} |d_i - e_i((\phi)|^2 \quad (13)$$

In summary, by normalizing the data under the signal model, one parameter can be eliminated, and the remaining problem is in the form of a least-square fit.

In a conventional usual fit, the desired parameters would be determined numerically with the aid of a non-linear optimizer. Here the running time for fitting is considerable, however, since the algorithm is run for each pixel in 2D, that is, for example, the calculation is carried out for over 100,000 pixels and the signal model is very often evaluated for each pixel, for example, more than 100 times. These non-linear optimizers typically find only one local minimum depending on the starting point. A number of optimization steps with different starting points only partly solves the problem and increases the overall running time considerably.

The invention exploits the fact that the optimization is carried out for very many points, such that a preliminary pre-processing step in the possible lookup table is acceptable and useful. Through the pre-processing of the lookup table that has been produced to create a sorted lookup table, it is ensured that a minimum is found for a large set of parameter points, for example, for more than 100,000 table entries each with one set of calculated MR signal values, as a result of which the global minimum is better ensured.

For a certain class of metrics, which also contains 12 and hence a least-square, the method of approximate nearest-neighbor search is possible. A lookup table with M elements of the above signal model is generated $$\{(F_1(\theta_m), \ldots, F_N(\theta))\}_{m=1,\ldots,M} \quad (14)$$

where M can be over 100,000. This lookup table is subsequently processed in a pre-processing step or in a configuration such that, given a measured data tuple with N values $(D_1, \ldots, D_N)$, the next point in the set, that is, in the pre-processed lookup table, can be quickly found in line with the metric. As a result of the pre-sorting, this is approximately comparable with $\log_2(M)$. For $\log_2 100,000 < \log_2 2^{17} = 17$, it is possible to find the optimized value in very few steps. Where it appears one-dimensionally and there is only one signal parameter, this is understandable since, with an ascending order of values in the lookup table, it can be seen with a starting value in the center whether the measured data value is greater or smaller than the value in the lookup table. If it is greater, the other half of the lookup table can be discarded, such that in each step approximately half of the remaining table can be discarded. Furthermore, $F_i(\theta)$ does not always have to be calculated afresh, which is numerically complex for many signal models since the function is only calculated when the lookup table is created.

When the aforementioned example is used with one contrast and one parameter, or in a scenario in which a reduction of the parameters results in one parameter, the pre-processing is equivalent to sorting according to size and the comparison has the logarithmic complexity of an interval nesting.

The method is summarized in conjunction with FIG. 3. In a step S31, the recording of the N different MR images of the examination subject ensues with N different contrasts. There likewise ensues in a step S32 the selection of the signal model with the m different signal parameters that influence the MR signal of the examination subject. In an optional step S33, the analytical reduction of variables ensues such that the method with fewer parameters is applicable to the new problem.

In a step S34, the selection of the selected signal parameters for which the lookup table is to be generated finally ensues. If the selected signal parameter contains the T1 time and the proton density $M_0$, for example, then these parameters are discretized in each case in a meaningful range of values and the various values are input into the signal model and thus the measurement signal is calculated with the signal model for the various combinations of T1 time and spin density. This leads in step S35 to the creation of the lookup table. In step S36, the pre-processing of this lookup table ensues such that a sorted lookup table is generated to allow a quick comparison. Here the pre-processing ensues such that the determination of the synthetic measured data point that is the nearest in the sorted lookup table at a given measured data point according to a given metric is possible approximately with few comparisons. Possible examples for the pre-processing are the following methods that are described in greater detail in:

kd-trees [J. L. Bentley. K-d trees for semidynamic point sets. In Proc. 6th Ann. ACM Sympos. Comput. Geom., pages 187-197, 1990. J. H. Friedman, J. L. Bentley, and R. A. Finkel. An algorithm for finding best matches in logarithmic expected time. ACM Transactions on Mathematical Software, 3(3):209-226, 1977.]

box-decomposition [S. Arya, D. M. Mount, N. S. Netanyahu, R. Silverman, and A. Wu. An optimal algorithm for approximate nearest searching. J. ACM, 45:891-923, 1998.]

tree-ordered search [S. Arya and D. M. Mount. Algorithms for fast vector quantization. In J. A. Storer and M. Cohn, editors, Proc. of DCC '93: Data Compression Conference, pages 381-390.IEEE Press, 1993]

priority search [S. Arya, D. M. Mount, N. S. Netanyahu, R. Silverman, and A. Wu. An optimal algorithm for approximate nearest neighbor searching. J. ACM, 45:891-923, 1998.]

J. Kleinberg. Two algorithms for nearest-neighbor search in high dimension. In Proc. 29th Annu. ACM Sympos. Theory Comput., pages 599-608, 1997.

Marius Muja and David G. Lowe: "Scalable Nearest Neighbor Algorithms for High Dimensional Data". Pattern Analysis and Machine Intelligence (PAMI), Vol. 36, 2014.

Marius Muja and David G. Lowe: "Fast Matching of Binary Features". Conference on Computer and Robot Vision (CRV) 2012.

[Marius Muja and David G. Lowe, "Fast Approximate Nearest Neighbors with Automatic Algorithm Configuration", in International Conference on Computer Vision Theory and Applications (VISAPP'09), 2009]

It is desirable here for the methods used to function with the 12 and 11 norm.

In a step S37, the determination ensues, preferably an approximate determination of the optimal signal model parameters in line with a metric or norm for a set of pixels, where this does not have to ensue for all the pixels in the recorded MR image. The set of pixels can be selected beforehand with a mask or segmentation.

It is optionally possible in a step S38 to use the calculated values from step S37 as the starting point for a non-linear optimization.

Furthermore, it is possible to create a number of separate lookup tables and to use them for different pixels, for example, for a quantitative fat-water separation, in which, if known for the pixel and if known whether it predominantly contains fat and water, a different lookup table is generated for the fat pixels than for the water pixels, since the signal models are different.

Overall, the method described in the aforementioned provides an improved quantitative spatially resolved determination of physiological tissue parameters. The parameter cards generated contain fewer artefacts since not only is the local minimum found, but the processing time is reduced considerably compared with conventional methods.

Examples of Practical Applications are a) Pharmacokinetic modelling of contrast-enhanced dynamic measurements. Here, the signal intensity is first translated into contrast agent concentrations and these are fitted on a perfusion model. The evaluation of the signal model can be relatively complex since a convolution with an arterial input function has to be carried out. Furthermore, the number of points in time, up to 100 for conventional parametric imaging, can be relatively high. The latter leads to an optimization problem that can more easily contain local minima and is also numerically more complex.
b) T1-determination by varying flip angles in a plurality of gradient echo measurements. Here the number of different contrasts is relatively low (typically <6). Therefore, it is also possible to use exact, instead of approximate, nearest-neighbor searches. The processing time is less relevant than the guarantee of finding the global minimum. The result of the search can also be used as the starting point for a further optimization.
c) Fat-water and R2*-determination in multi-echo gradient echo measurements. Here the number of different contrasts is relatively low (typically <8). Therefore, it is also possible to use exact, instead of approximate, nearest-neighbor searches. The processing time is less relevant than the guarantee of finding the global minimum. The result of the search can also be used as the starting point for a further optimization. It is possible to define two lookup tables for fat- and water-dominated pixels.
d) T1- or T2-determination by sampling a relaxation curve. Here the number of different contrasts is moderate (typically <20). Therefore, approximate nearest-neighbor searches are to be preferred. The processing time is less relevant than the guarantee of finding the (approximate) global minimum. The result of the search can also be used as the starting point for a further optimization.

IVIM or DKI evaluation of diffusion measurements with a different diffusion weighting. Here the number of different contrasts is moderate (typically <20). Therefore, approximate nearest-neighbor searches are to be preferred. The processing time is less relevant than the guarantee of finding the global minimum (approximately). The result of the search can also be used as the starting point for a further optimization.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance (MR) method for the quantitative spatially resolved determination of a physiological tissue parameter of an examination subject, comprising:
   in a computer, determining a signal model with m different signal parameters, the m different signal parameters comprising physiological tissue parameters that influence an MR signal used to perform MR image acquisition of the examination subject;
   operating an MR data acquisition scanner to acquire N different MR images of the examination subject, with m⇐N;
   in said computer, determining measured data tuples with N measured values from the N MR images on a pixel-by-pixel basis;
   in said computer, generating a lookup table with a plurality of table entries, wherein each one of the plurality of table entries assigns an N-dimensional tuple of synthesized signal model values that are calculated using the signal model to an m-dimensional tuple of the m different signal parameters;
   in said computer, sorting the lookup table that has been generated according to a defined criterion to produce a sorted lookup table; and
   in said computer, determining at least some of the signal parameters by comparing pixel-by-pixel measured data tuples with N-dimensional tuples of the synthesized signal model values in the sorted lookup table for at least some of the pixels.

2. The method as claimed in claim 1, comprising:
   acquiring said N MR images by sampling a respective raw data space for each MR image so as to generate the MR images having a morphological meaningful contrast that allows diagnosing of the examination subject.

3. The method as claimed in claim 1, wherein N is less than 100.

4. The method as claimed claim 1, wherein N is less than 50.

5. The method as claimed claim 1, wherein N is less than or equal to 10.

6. The method as claimed claim 1, comprising:
   arranging the table entries in the sorted lookup table so as to allow determination of a synthetic signal model value that, according to a given metric, is nearest in the sorted lookup table to a measured data tuple using a nearest-neighbor search.

7. The method as claimed in claim 6, comprising:
   implementing the nearest-neighbor search using a number of comparison steps that is of an order of magnitude of a logarithm of the number of entries in the sorted lookup table.

8. The method as claimed in claim 1, wherein the act of determining at least some of the signal parameters by comparing pixel-by-pixel measured data tuples with N-dimensional tuples of the synthesized signal model values in the sorted lookup table comprises using an optimization method in the comparison.

9. The method as claimed in claim 1, comprising:
   analytically eliminating at least one signal parameter from the m different signal parameters,
   wherein the number of the signal parameters contained in the lookup table is less than m.

10. The method as claimed claim 1, comprising:
determining the physiological tissue parameter using an approximate nearest-neighbor search.

11. The method as claimed claim 1, comprising:
using the physiological tissue parameter that has been determined as a starting point of a non-linear optimization to determine an additional physiological tissue parameter.

12. The method as claimed claim 1, comprising:
subdividing the pixels in the recorded MR images into at least 2 different pixel classes as a function of a physiological tissue parameter, with a lookup table being created for each pixel class.

13. The method as claimed in claim 1, wherein the physiological tissue parameters associated with the m different signal parameters include at least one of a signal longitudinal relaxation time T1 or a proton density M0 of an examined tissue of the examination subject.

14. A magnetic resonance (MR) apparatus, comprising:
an MR data acquisition scanner;
a computer configured to determine a signal model with m different signal parameters, the m different signal parameters comprising physiological tissue parameters that influence an MR signal used to perform MR image acquisition of an examination subject;
said computer being configured to:
operate the MR data acquisition scanner to acquire N different MR images of the examination subject, with $m \Leftarrow N$;
determine measured data tuples with N measured values from the N MR images on a pixel-by-pixel basis;
generate a lookup table with a plurality of table entries, wherein each entry assigns an N-dimensional tuple of synthesized signal model values to an m-dimensional tuple of the m different signal parameters that have been calculated using the signal model;
sort the lookup table that has been generated according to a defined criterion to produce a sorted lookup table; and
determine at least some of the signal parameters by comparing the pixel-by-pixel measured data tuples with N-dimensional tuples of the synthesized signal model values in the sorted lookup table for at least some of the pixels.

15. A non-transitory, computer-readable data storage medium encoded with programming instructions, said storage medium being loaded into a computer system of a magnetic resonance (MR) apparatus comprising an MR data acquisition scanner, said programming instructions when executed by said computer system causing said computer system to:
determine a signal model with m different signal parameters, the m different signal parameters comprising physiological tissue parameters that influence an MR signal used to perform MR image acquisition of an examination subject;
operate the MR data acquisition scanner to acquire N different MR images of the examination subject, with $m \Leftarrow N$;
determine measured data tuples with N measured values from the N MR images on a pixel-by-pixel basis;
generate a lookup table with a plurality of table entries, wherein each entry assigns an N-dimensional tuple of synthesized signal model values to an m-dimensional tuple of the m different signal parameters that have been calculated using the signal model;
sort the lookup table that has been generated according to a defined criterion to produce a sorted lookup table; and
determine at least some of the signal parameters by comparing the pixel-by-pixel measured data tuples with N-dimensional tuples of the synthesized signal model values in the sorted lookup table for at least some of the pixels.

* * * * *